(12) United States Patent
Tang et al.

(10) Patent No.: US 8,714,778 B2
(45) Date of Patent: May 6, 2014

(54) LIGHT-EMITTING DIODE (LED) MODULE WITH LIGHT SENSOR CONFIGURATIONS FOR OPTICAL FEEDBACK

(71) Applicant: TSMC Solid State Lighting Ltd., HsinChu (TW)

(72) Inventors: Yu-Sheng Tang, Zhudong Township (TW); Yi-Tsuo Wu, Yonghe (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 0 days.

(21) Appl. No.: 13/927,421

(22) Filed: Jun. 26, 2013

(65) Prior Publication Data

US 2013/0285102 A1    Oct. 31, 2013

Related U.S. Application Data

(63) Continuation of application No. 12/881,566, filed on Sep. 14, 2010, now Pat. No. 8,496,353.

(51) Int. Cl.
*F21V 33/00* (2006.01)
*F21V 9/00* (2006.01)
*H05B 37/02* (2006.01)

(52) U.S. Cl.
USPC ........... 362/276; 362/234; 362/231; 362/253; 315/149; 315/312; 315/307

(58) Field of Classification Search
USPC ......... 362/230, 231, 800, 234, 253, 276, 802, 362/804, 572–575; 315/312, 307, 149, 152, 315/360, 169.1, 169.3
See application file for complete search history.

(56) References Cited

U.S. PATENT DOCUMENTS

| 6,127,783 A | 10/2000 | Pashley et al. |
|---|---|---|
| 6,741,351 B2 | 5/2004 | Marshall et al. |
| 2010/0118543 A1 | 5/2010 | Hong |

*Primary Examiner* — Joseph L Williams
(74) *Attorney, Agent, or Firm* — Haynes and Boone, LLP

(57) ABSTRACT

An embodiment of the disclosure includes a LED module. A substrate is provided. A light sensor is positioned in the substrate. A LED chip is attached to the substrate. The LED chip has a first side and a second side. The second side is covered by an opaque layer with an opening. The opening is substantially aligned with the light sensor. The light sensor receives a light output emitting from the LED chip through the opening.

20 Claims, 15 Drawing Sheets

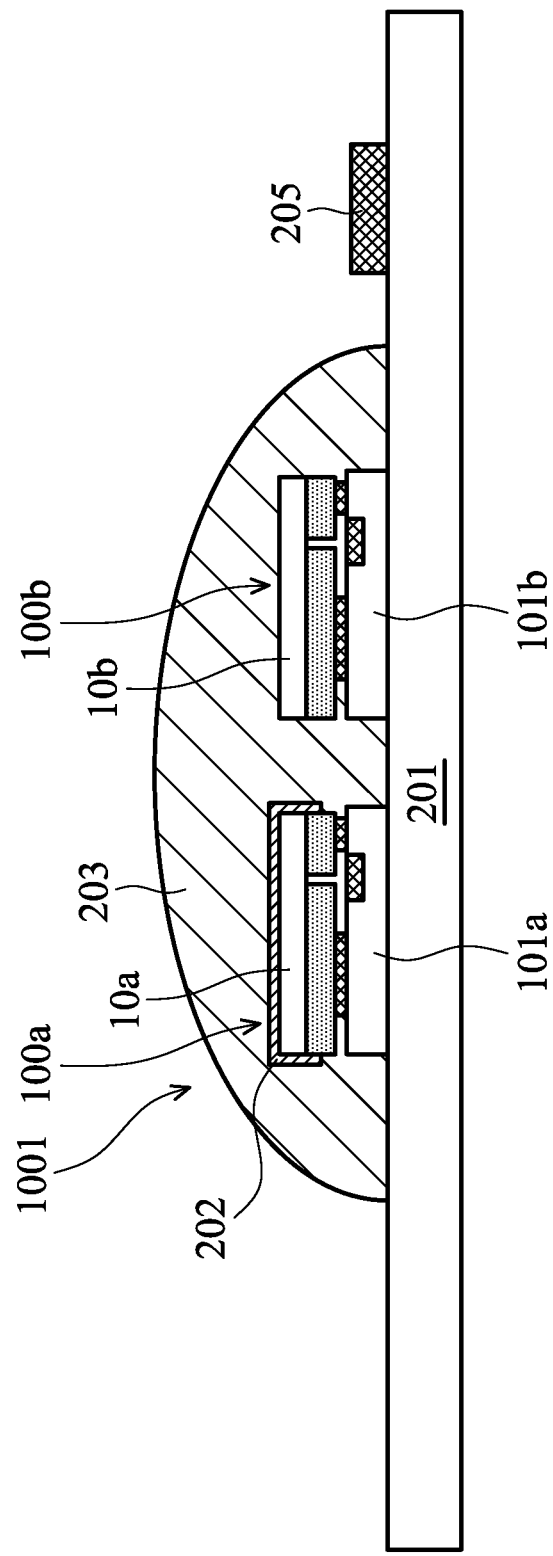

US 8,714,778 B2

LIGHT-EMITTING DIODE (LED) MODULE WITH LIGHT SENSOR CONFIGURATIONS FOR OPTICAL FEEDBACK

CROSS REFERENCE TO RELATED APPLICATION

This application is a continuation application of U.S. patent application Ser. No. 12/881,566, filed Sep. 14, 2010, now allowed, the contents of which is hereby incorporated herein by express reference thereto.

TECHNICAL FIELD

The disclosure relates generally to a Light-Emitting Diode (LED) module, and more particularly to an LED module having specific light sensor configurations for optical feedback.

BACKGROUND

A Light-Emitting Diode (LED), as used herein, is a semiconductor light source for generating a light at a specified wavelength or a range of wavelengths. LEDs are traditionally used for indicator lamps, and are increasingly used for displays. An LED emits light when a voltage is applied across a p-n junction formed by oppositely doped (and typically compound) semiconductor layers. Different wavelengths of light can be generated using different materials by varying the bandgaps of the semiconductor layers and by fabricating an active layer within the p-n junction.

LEDs are semiconductor based. For a given drive current, light output varies from chip to chip, and also varies over the life of each chip. Light output also varies inversely with temperature, but not uniformly for each color. Finally, in a block of LEDs of a given color, the light output will vary if one or more of the LEDs fails. Given all the factors which can affect the color balance of any array of LEDs, it would be desirable to automatically monitor and regulate the color balance, especially in a white-light emitting module.

In an array of LEDs of the same color, for example a traffic light, variations in light output based on temperature can be compensated by varying the current supplied to the array. This scheme would be cumbersome in a module having LEDs in a plurality of colors, because the variation in light output due to temperature is not the same for the various colors.

It would be desirable to be able to compensate for the different temperature variations in output in a multicolor array of LEDs. For example, it would be desirable to automatically control the chromaticity of a white light emitting module comprising red, blue and green LEDs, without regard to the factors which cause the light outputs of the individual colors to vary.

It would further be desirable to automatically control the variation of each color LED without resorting to a spectrally resolving light measuring system, such as a photodiode and filter, for each of the respective colors.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

Figure 1:
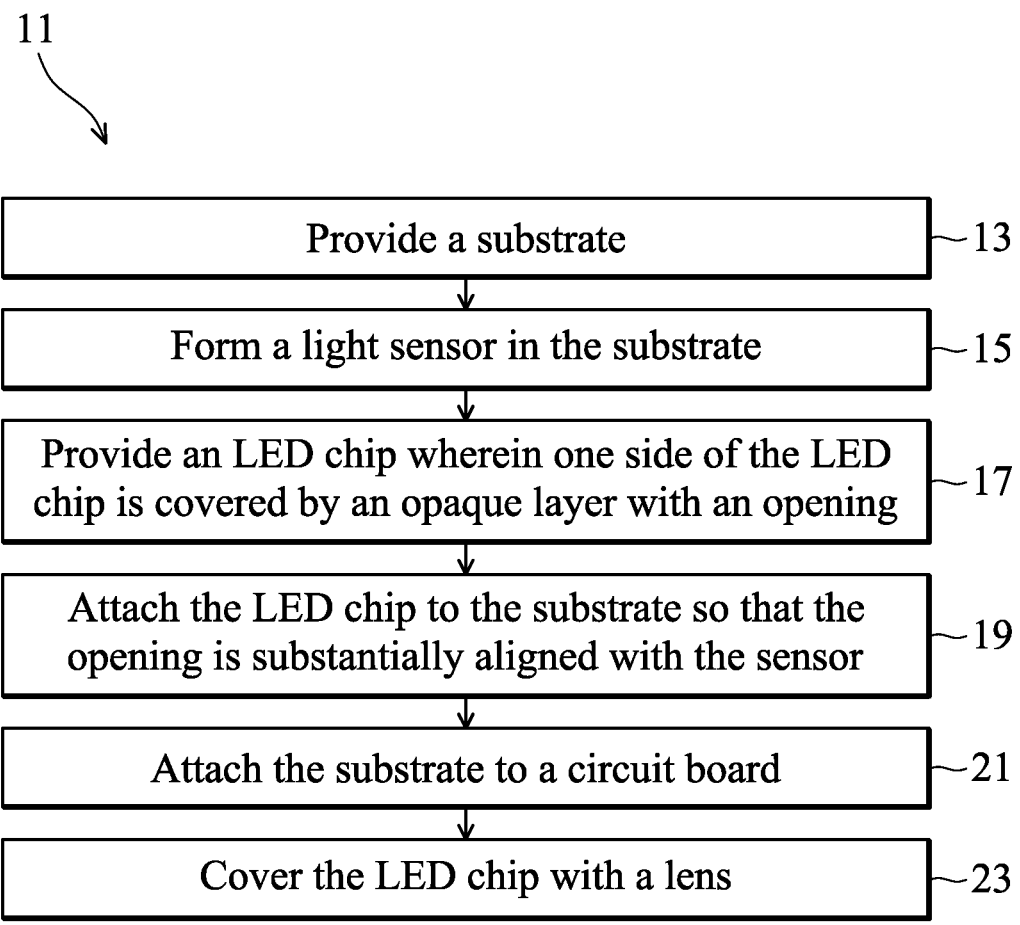
FIGS. 1 and 2 are flowcharts of methods for fabricating Light-Emitting Diode (LED) modules according to embodiments of the disclosure.
Figure 2:
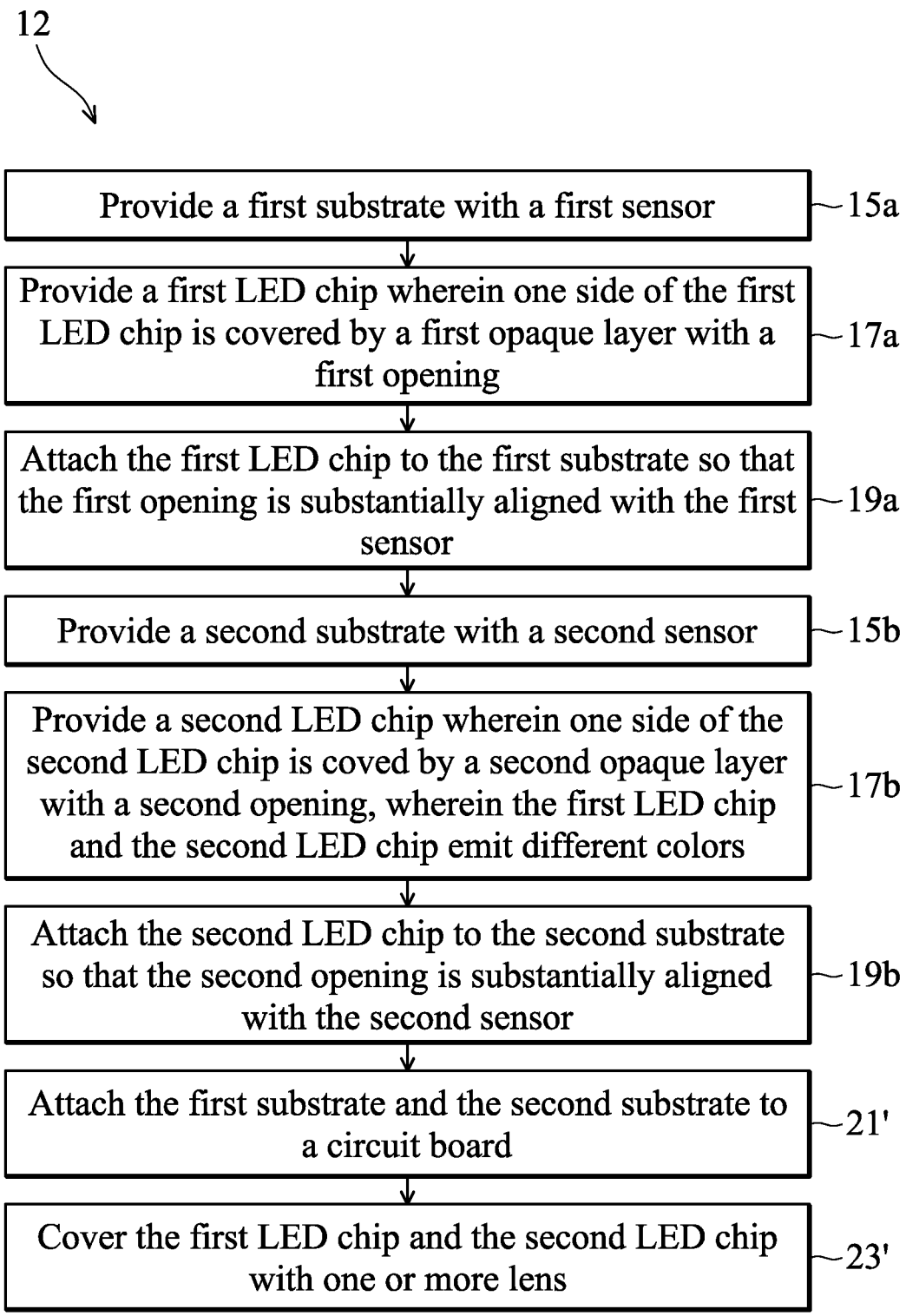
Figure 9:
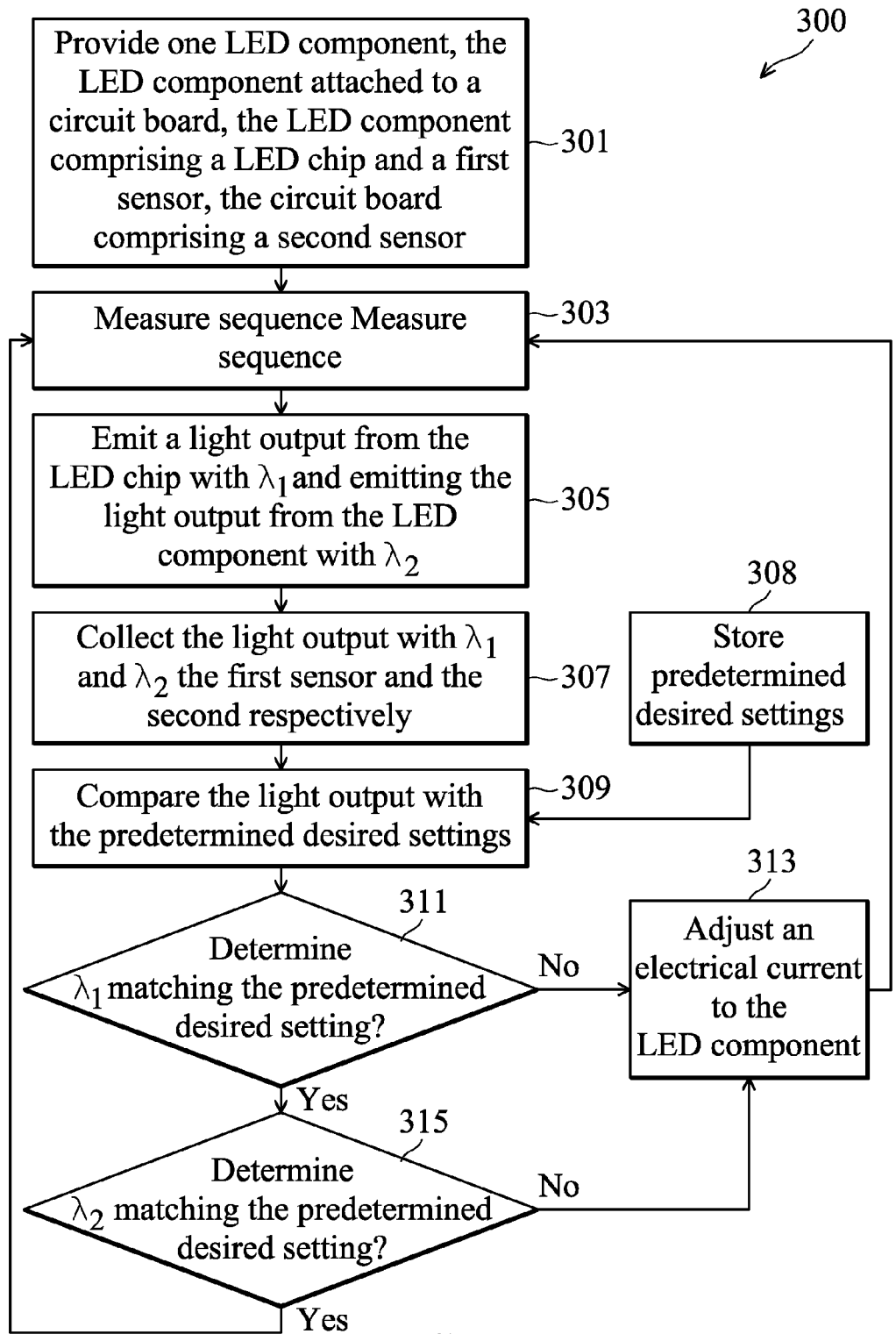
FIGS. 9 and 10 are diagrams of methods for operation of a LED module with optical feedback and control portion.
Figure 10:
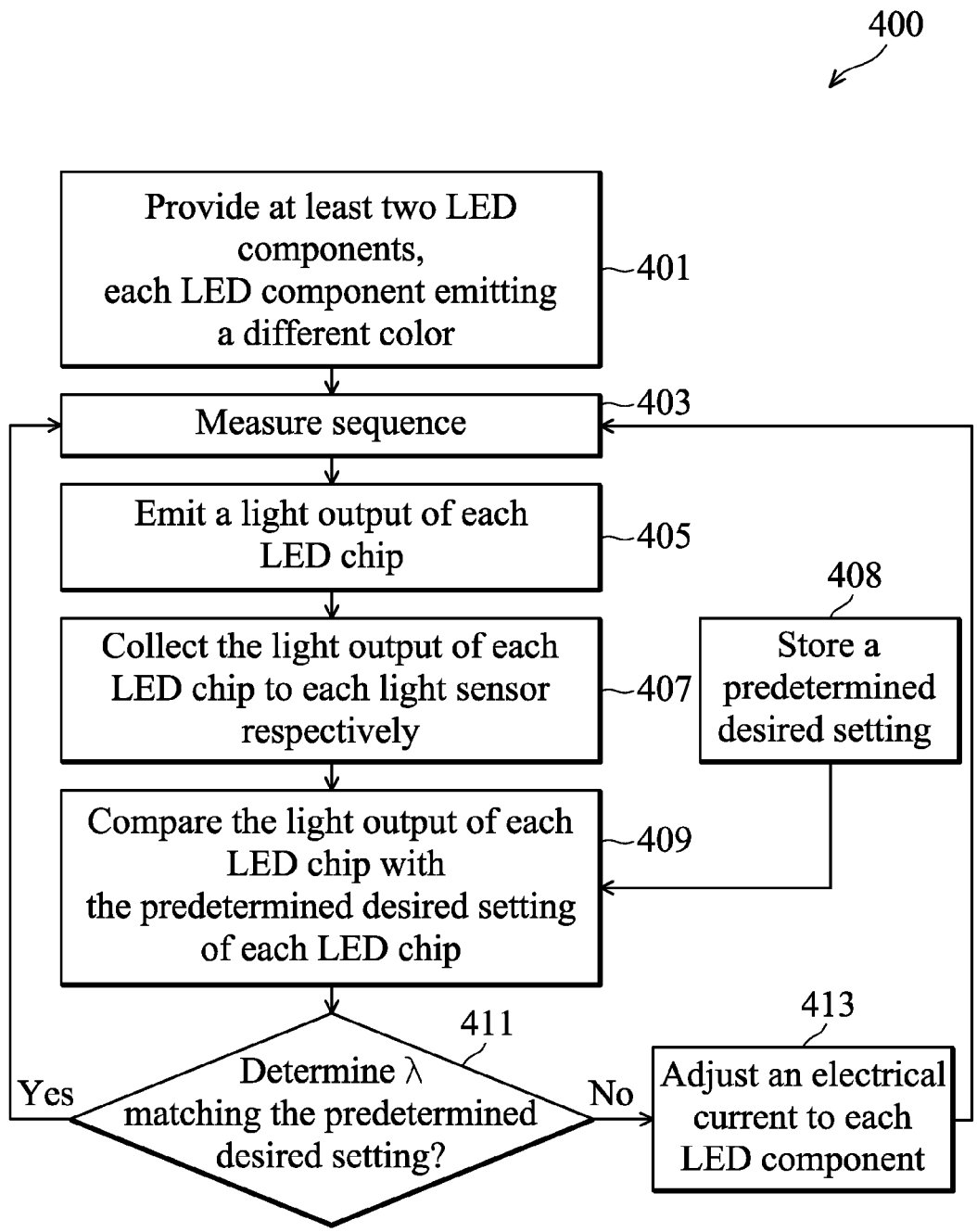

Illustrated in FIGS. 1 and 2 are flowcharts of methods 11 and 12 for fabricating Light-Emitting Diode (LED) modules according to embodiments of the disclosure. FIG. 1 illustrates generalized steps that are performed with various embodiments of the disclosure. FIG. 2 illustrates different embodiments that include the generalized steps of FIG. 1. FIGS. 3 to 8 are cross-sectional views of LED modules at various stages of manufacture according to FIGS. 1 and 2. FIGS. 9 and 10 are flowcharts illustrating the method of operation of a LED module with optical feedback and control in accordance with this disclosure.

An LED module may be a part of a display or lighting device having a number of modules, the LEDs in each module being either controlled singly or in combination. The LED may also be a part of an integrated circuit (IC) chip, system on chip (SoC), or portion thereof, that may include various passive and active microelectronic devices such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high power MOS transistors, or other types of transistors. It is understood that various figures have been simplified for a better understanding of the inventive concepts of the present disclosure. Accordingly, it should be noted that additional processes may be provided before, during, and after the methods of FIGS. 1 and 2. Some other processes may only be briefly described, and various known processes may be substituted for the described processes to achieve the same effect.

Figure 3:
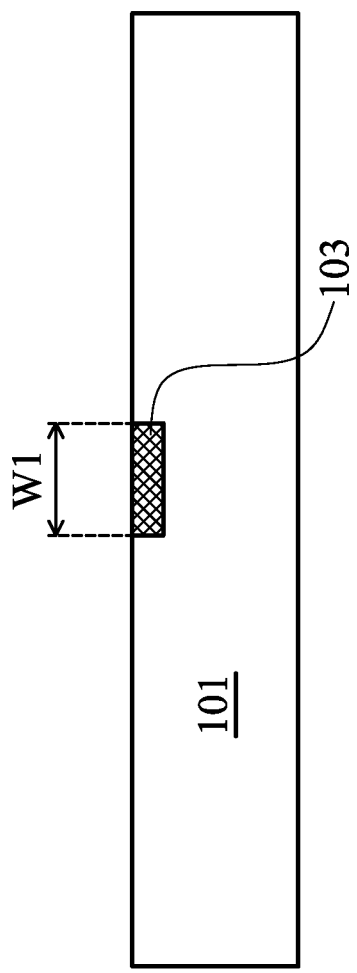
FIGS. 3 to 7 and 8a, 8A, 8b, 8B, 8c, and 8C are cross-sectional views of LED modules at various stages of manufacture according to FIGS. 1 and 2.

Referring to FIG. 1 and FIG. 3, in process step 13, a substrate 101 is provided. The substrate 101 refers to a semiconductor substrate on which various layers and integrated circuit components are formed. The substrate 101 may comprise silicon or a compound semiconductor, such as GaAs, InP, Si/Ge, or SiC. Examples of layers may include dielectric layers, doped layers, metal layers, polysilicon layers and via plugs that may connect one layer to one or more layers. Examples of integrated circuit components may include transistors, resistors, and/or capacitors. The substrate 101 may be part of a wafer that includes a plurality of semiconductor dies fabricated on the surface of the substrate, wherein each die comprises one or more integrated circuits. The plurality of semiconductor dies are divided by scribe lines (not shown) between the dies.

Referring to FIG. 1 and FIG. 3, in process step 15, a light sensor 103 is formed in the substrate 101. The light sensor 103 has a width W1. In one embodiment, the light sensor 103 may be disposed over a top surface of the substrate 101 and extended into the substrate 101. In another embodiment, the light sensor 103 may be disposed above the top surface of the substrate 101. The light sensor 103 may include a light-sensing region which may be a doped region having N-type and/or P-type dopants formed in the substrate 101 by a method such as diffusion or ion implantation. The light-sensing region detects light that shines on it. The light sensor 103 may include photosensitive diodes or photodiodes for recording an intensity or brightness of light on the diode. Connections to the light-sensing region may comprise interconnect regions in the substrate 101 to TSV connections extending through the substrate 101.

Figure 4:
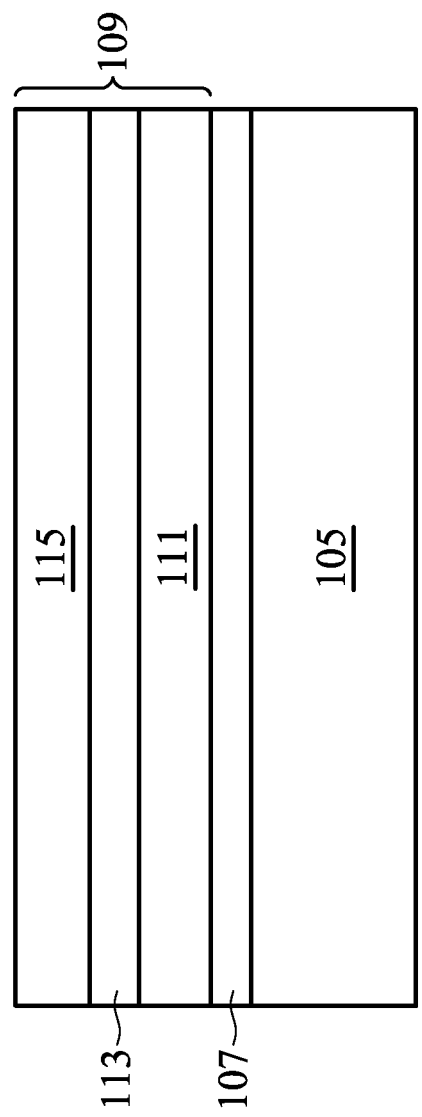

Referring to FIG. 1 and FIG. 4, in process step 17, a LED chip is provided. The LED chip is fabricated on a growth substrate 105, and includes a material that is suitable for growing a light-emitting structure 109. In one embodiment, the growth substrate 105 is sapphire. In other embodiments, the growth substrate 105 may be silicon carbide, silicon, gallium nitride, or another suitable material for growing the light-emitting structure 109.

Referring to FIG. 4, a buffer layer 107, often comprising gallium nitride or aluminum nitride, is grown on the growth substrate 105 in an epitaxial growth processes. The buffer layer may be about 500 nm to 5 pm, for example, about 2 pm. A light-emitting structure 109 is formed over the buffer layer. The light-emitting structure 109 is usually a semiconductor diode. In the present embodiment, the light-emitting structure 109 includes a doped layer 111, a multiple quantum well layer (MQW) 113, and a doped layer 115. The doped layers 111 and 115 are oppositely doped semiconductor layers. In some embodiments, the doped layer 111 includes an n-type gallium nitride material, and the doped layer 115 includes a p-type gallium nitride material. In other embodiments, the doped layer 111 may include a p-type gallium nitride material, and the doped layer 115 may include an n-type gallium nitride material. The MQW layer 113 shown in FIG. 4 includes alternating (or periodic) layers of two different compound semiconductor materials, for example, gallium nitride and indium gallium nitride. For example, in one embodiment, the MQW layer 113 includes ten layers of gallium nitride and ten layers of indium gallium nitride, where an indium gallium nitride layer is formed on a gallium nitride layer, and another gallium nitride layer is formed on the indium gallium nitride layer, and so on and so forth. The light emission efficiency of the structure 109 depends on the number of alternating layers and thicknesses of those layers. The thickness of the MQW layer 113 may be about 10-2000 nm, about 100-1000 nm, about 1 μm, or about 100 nm, for example.

In FIG. 4, the doped layer 111, the MQW layer 113, and the doped layer 115 are all formed by epitaxial growth processes. The layers 111, 113 and 115 are epitaxially grown on the buffer layer 107. The doping may be accomplished by adding impurities into a source gas during the epitaxial growth process or by other commonly used doping processes. After the completion of the epitaxial growth process, a p-n junction (or a p-n diode) is essentially formed in the MQW layer 113 between the doped layer 111 and the doped layer 115. When an electrical voltage is applied between the doped layer 111 and the doped layer 115, electrical current flows through the light-emitting structure 109 and the structure 109 emits radiation. The color of the light emitted by the structure 109 is determined by the wavelength of the emitted radiation, which may be "tuned" (or selected) by varying the composition and structure of the materials that make up the structure 109. For example, a small increase in the concentration of indium in the indium gallium nitride layer in the MQW 113 is associated with a shift of the light's wavelength output toward longer wavelengths.

Figure 5:
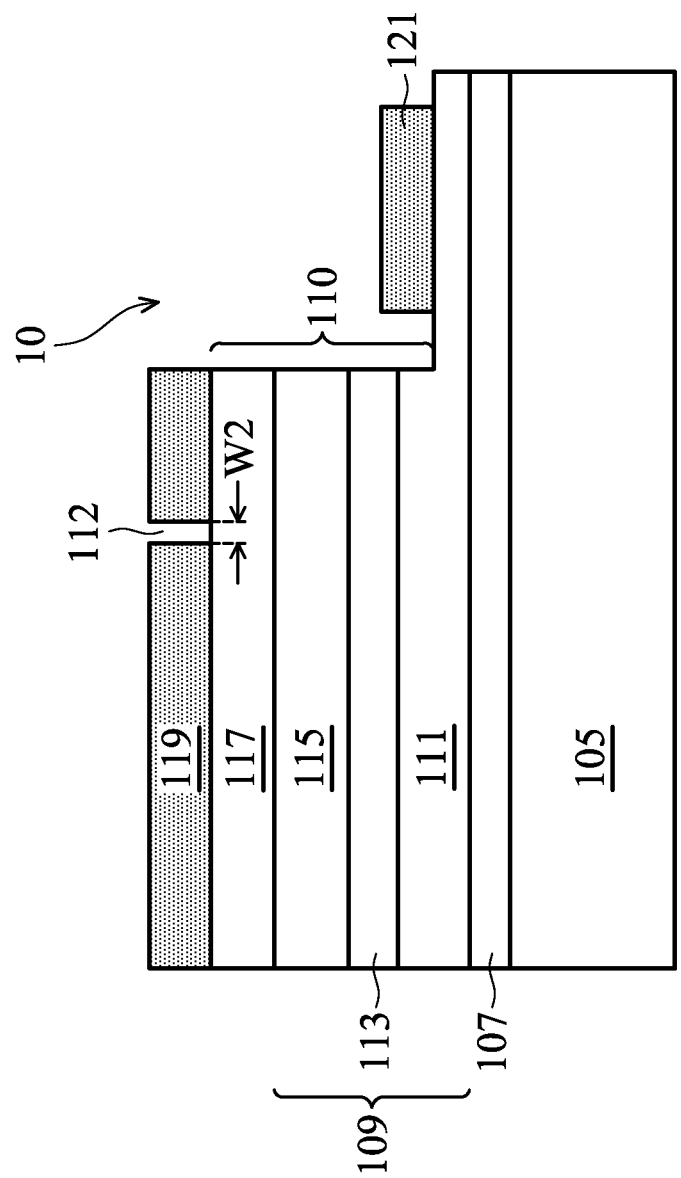

Referring to FIG. 5, a contact layer 117 is formed on the light-emitting structure 109. The contact layer 117 may be added on the doped layer 115 to form an ohmic contact. Then, a mesa structure 110 is defined by photolithography patterning processes and etching processes. The mesa structure 110 is etched from the top surface of the contact layer 117 to expose a middle portion of the doped layer 111.

A light reflecting layer 119 is formed on the contact layer 117 and the exposed surface of the doped layer 111. Then, the light reflecting layer 119 is patterned by photolithography patterning processes and etching process to form an opening 112 with a width W2 in the light reflecting layer 119 and a contact portion 121 on the exposed surface of the doped layer 111. Consequently, a LED chip 10 is formed. The process step 17 in FIG. 1, a LED chip 10 with one side of the LED chip 10 covered by the opaque layer 119 with the opening 112, is provided. The light reflecting layer 119 is an opaque layer and may reflect the radiation emitting from the light-emitting structure 109. The light reflecting layer 119 may be a metal, such as aluminum, copper, titanium, silver, gold, alloys of these such as titanium/platinum/gold, or combinations thereof. Particularly, silver and aluminum are known to be good reflectors of blue light. The light-reflecting layer 119 may be formed by a physical vapor deposition (PVD) process, a chemical vapor deposition (CVD), an electroplating process, or other deposition processes. Additional layers may be optionally formed not shown in FIG. 5. For example, an indium tin oxide (ITO) layer, or another transparent conductive layer may be formed.

Figure 6:
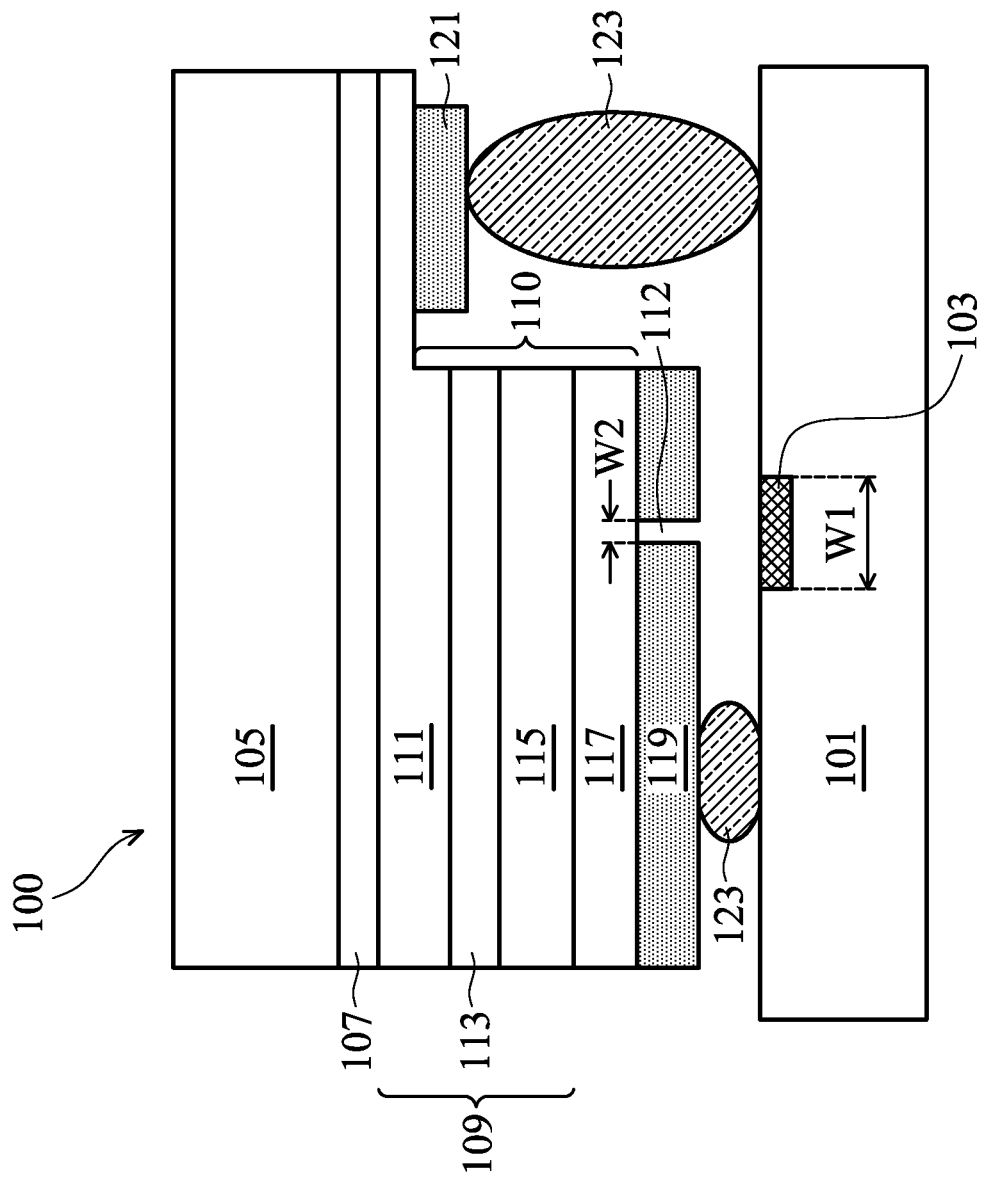

Referring to FIG. 1 and FIG. 6, in process step 19, the LED chip 10 shown in FIG. 5 is attached to the substrate 101 to form a LED component 100. The opening 112 is substantially aligned with the light sensor 103 in the substrate 101. The LED chip 10 is flipped over and bonded to the substrate 101 by using a solder 123 for electrical connection. In the embodiment shown in FIG. 6, the width W1 of the light sensor 103 is wider than the width W2 of the opening 112. In other embodiments, the width W2 may be equal to or greater than W1, but the smaller the width W2 of the opening 112 the more light is reflected upward. A light output emitting from the MQW layer 113 of the LED chip 10 through the opening 112 is collected by the light sensor 103. The majority of the light output from the MQW layer 113 is reflected upward by the light reflecting layer 119. The distance between the opening 112 and the light sensor 103 is small. Hence, the light output could be collected without any interference.

Figure 7:
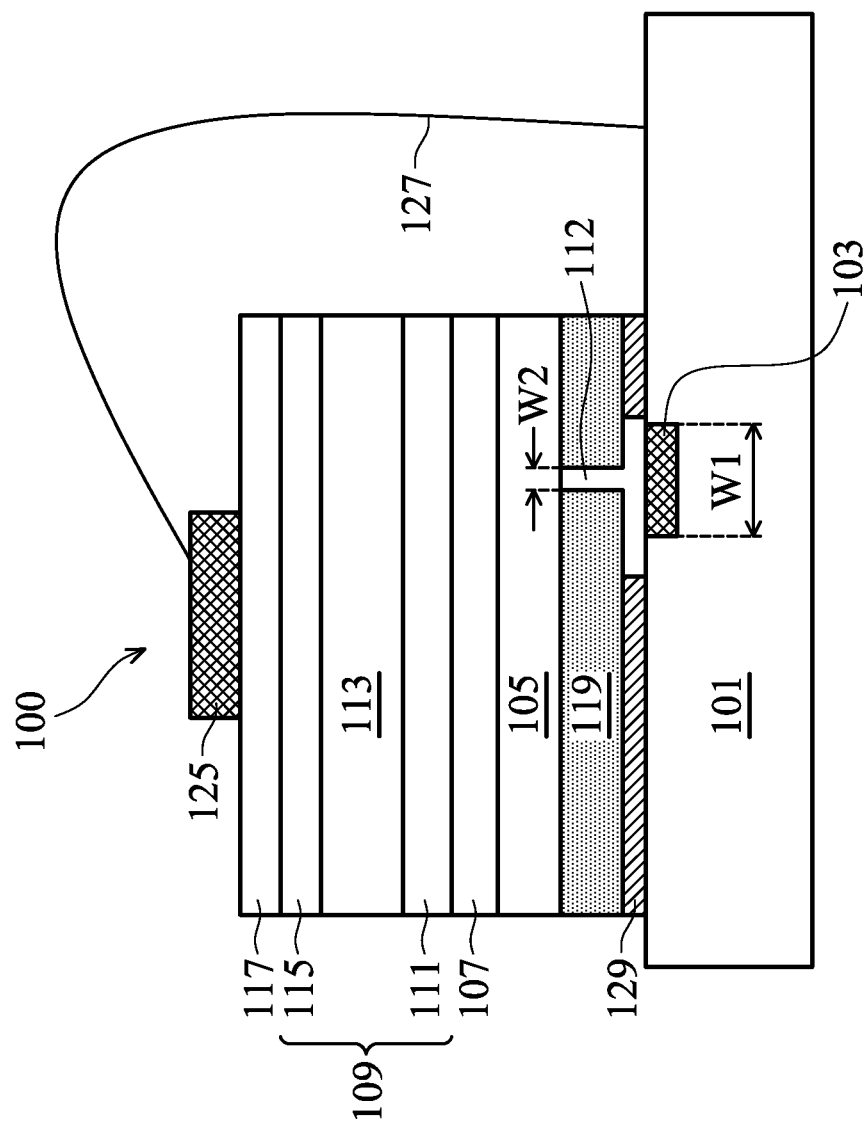

Referring to FIG. 7, another embodiment of the LED component 100 is shown. The layers stack of the LED chip is similar to FIG. 5 except that light reflecting layer 119 is formed on the bottom surface of the substrate 105 and a contact portion 125 is formed over the contact layer 117. The LED chip 10 is bonded to the substrate 101 by using an adhesive material 129. A wire 127 electrically contacts the contact portion 125 and the substrate 101 to provide electrical connection between the LED chip 10 and the substrate 101. The opening 112 in the reflecting layer 119 is substantially aligned with the light sensor 103 in the substrate 101. In the embodiment shown in FIG. 7, the width W1 of the light sensor 103 is wider than the width W2 of the opening 112. A light output emitting from the MQW layer 113 of the LED chip penetrating through the opening 112 is collected by the light sensor 103.

Figure 8A:
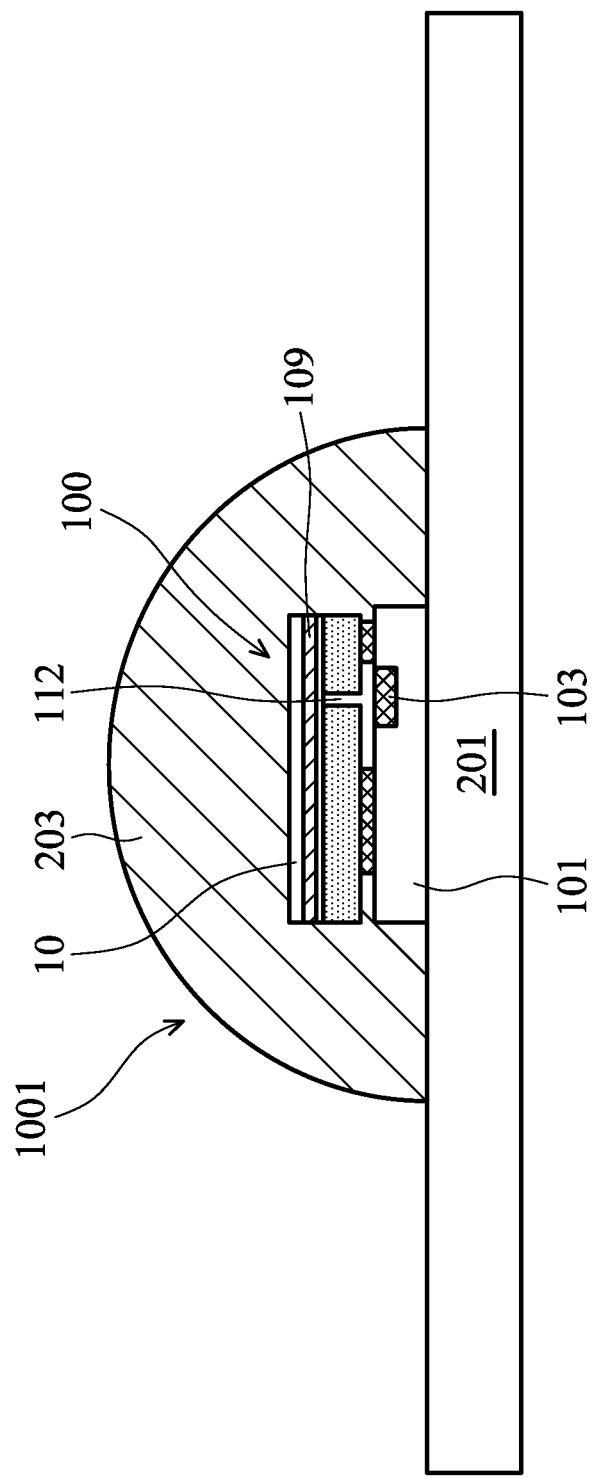
Figure 8A:
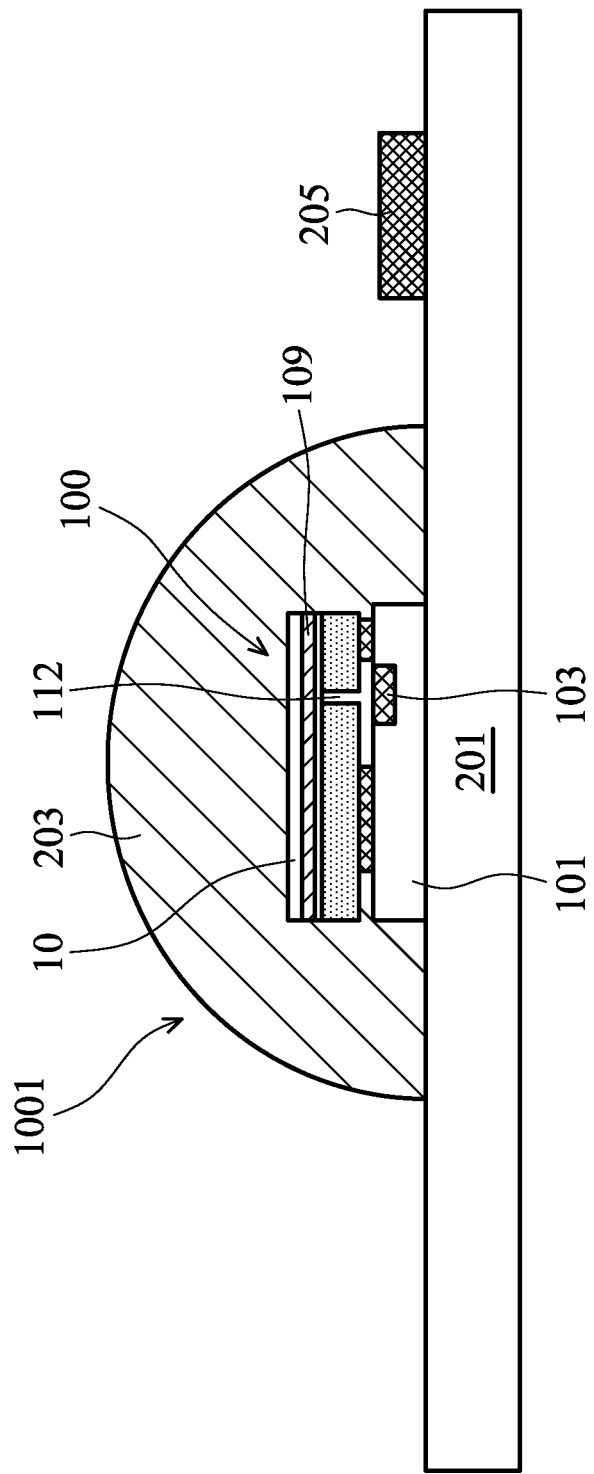

Referring to FIG. 1 and FIG. 8a, in process step 21, the substrate 101 portion of the LED component 100 is attached to a circuit board 201. The circuit board 201 electrically connects to the LED chip 10 and the sensor 103 through interconnects in the substrate 101. For the sake of simplicity and brevity, the LED component 100 is shown as a simple chip without further details. In one embodiment, the circuit board 201 may include package substrate, printed circuit board or any suitable component being familiar to those skilled in the art.

Referring to FIG. 1 and FIG. 8a, in process step 23, the LED chip 10 of LED component 100 is covered with a lens 203 to form a LED module 1001. The lens 203 may be formed by inserting a lens glue or molding material into a mold cavity covering the LED component 100. The lens glue is cured so that it retains its shape and adheres to the circuit board 201 and the LED component 100. In one embodiment, the lens 203 comprises a phosphor material to generate a specific color. To generate white light from the LED module 1001, at least one phosphor material is used. For example, a white light may be generated using a blue LED chip with yellow phosphor or with a red phosphor and green phosphor.

Referring to FIG. 8A, another embodiment of the LED module 1001 is shown. The LED module 1001 comprises the LED component 100 covered by the lens 203 and a second light sensor 205 positioned on the circuit board 201 not underneath the LED chip 10. In one embodiment, the second light sensor 205 is not covered by the lens 203. A light output with a first wavelength emitting from the light—emitting structure 109 of the LED chip 10 through the opening 112 is collected by the light sensor 103. The light output with the first wavelength excites the phosphor material in the lens 203 to convert the light output with a second wavelength. The light output with the second wavelength emitting out the LED component 100 is collected by the second light sensor 205.

Referring to FIG. 2, method 12 illustrates different embodiments that include the generalized steps of the method 11 in FIG. 1. The method 12 for fabricating Light-Emitting Diode (LED) modules begins at step 15a, which is the same as the process step 13 and 15 in the method 11. A first light sensor is provided on a first substrate.

Next, the process step 17a of method 12, which is the same as the process step 17 in method 11, is performed. A first LED chip with one side of the first LED chip covered by a first opaque layer with a first opening is provided. The cross-sectional views at various stages of the process step 17a are illustrated in FIGS. 4 to 5.

Then, the process step 19a of method 12, which is the same as the process step 19 in method 11, is performed. The first LED chip is attached to the first substrate to form a first LED component. The first opening in the first opaque layer is substantially aligned with the first light sensor. Different embodiments of cross-sectional views of the process step 19a are illustrated in FIGS. 6 and 7.

The process steps 15b to 19b form a second LED component. The step 15b to 19b repeat step 15a to 19a on the second LED component. In step 15b, a second light sensor is provided on a second substrate.

Next, the process step 17b of method 12, a second LED chip with one side of the second LED chip covered by a second opaque layer with a second opening is provided. The cross-sectional views at various stages of the process step 17b are illustrated in FIGS. 4 to 5. The first LED chip and the second LED chip emit different colors. The details of the first LED chip and the second LED chip will be introduced later.

Then, in the process step 19b of method 12, the second LED chip is attached to the second substrate to form the second LED component. The second opening in the second opaque layer is substantially aligned with the second light sensor. Different embodiments of cross-sectional views of the process step 19b are illustrated in FIGS. 6 and 7.

The method 12 continues to process step 21'. The first substrate of the first LED component and the second substrate of the second LED component are attached to a circuit board.

Next, method 12 continues to process 23'. The first LED chip of the first LED component and the second LED chip of the second LED component are covered by one or more lens to form a LED module.

Figure 8B:
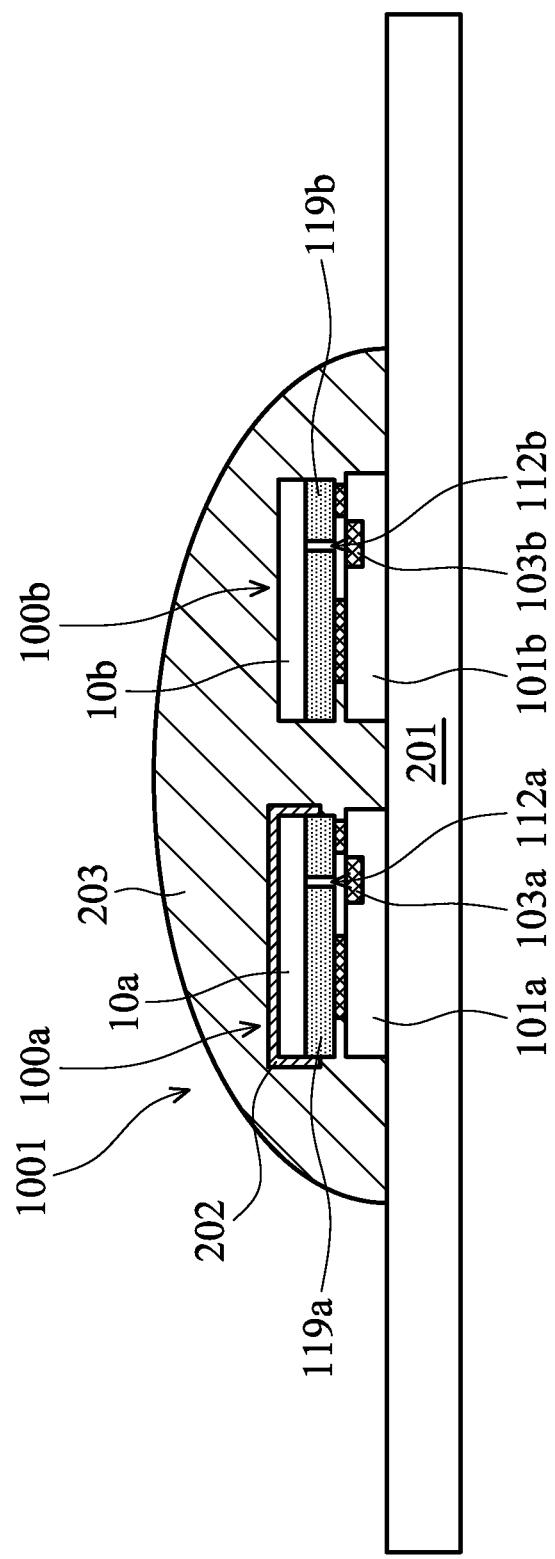
Figure 8C:
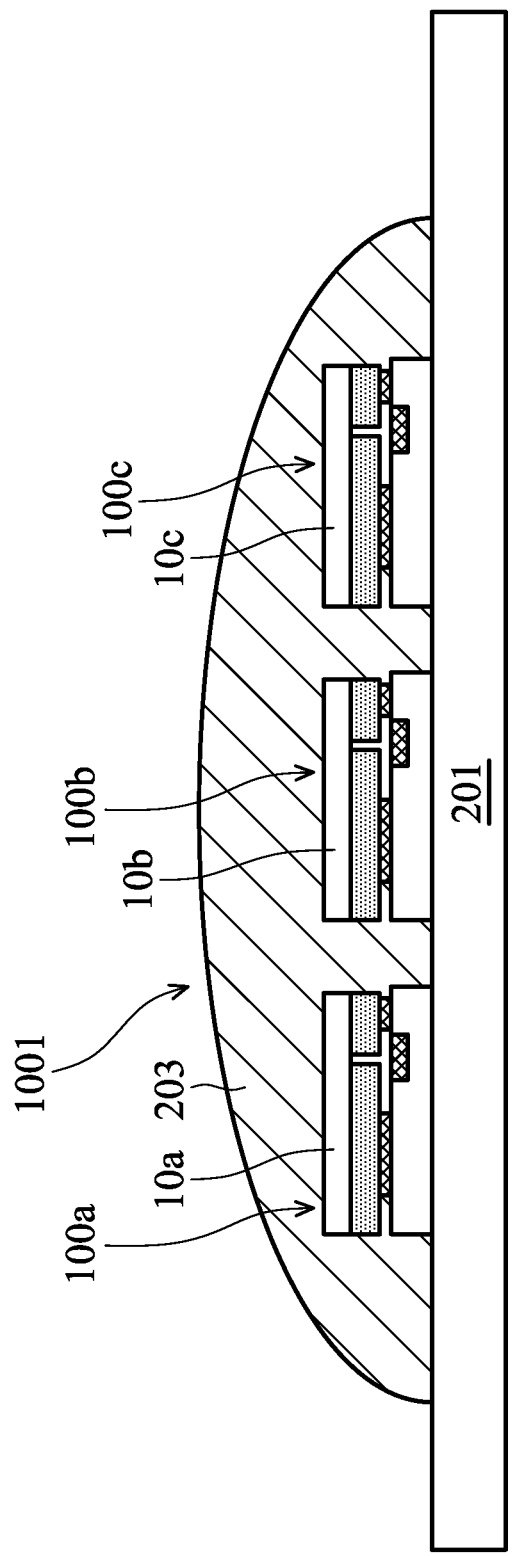
Figure 8C:
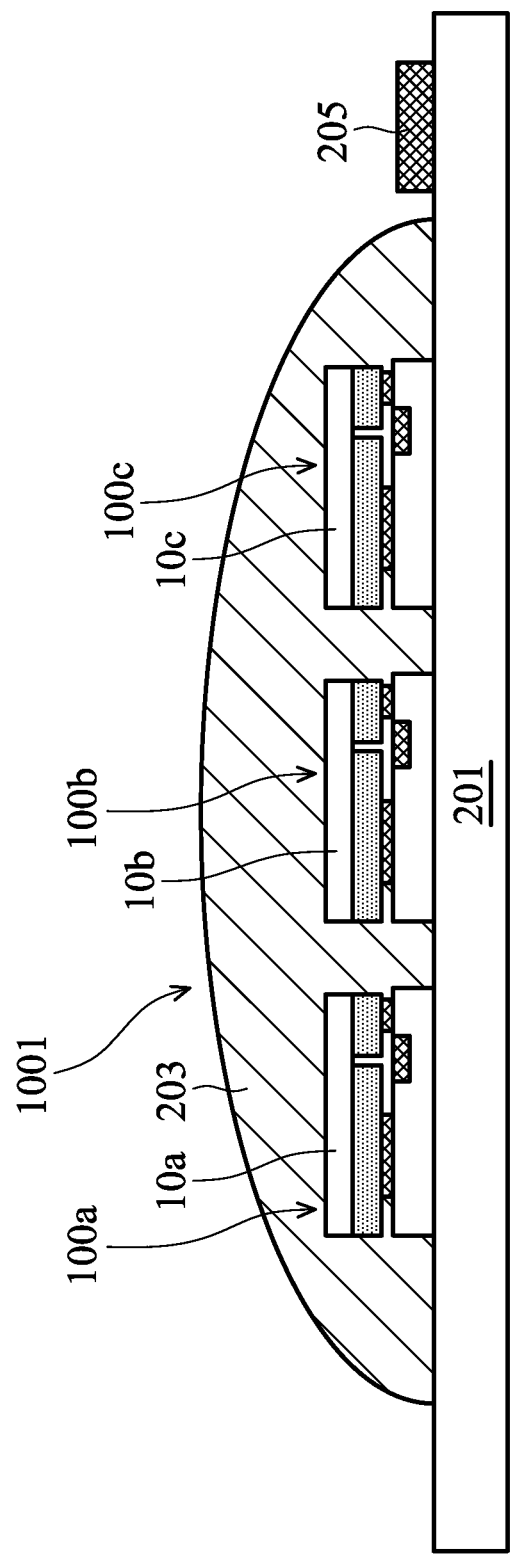

FIG. 8b to FIG. 8C illustrate various embodiments of cross-sectional views for the LED module formed by the method 12. The details of a first LED component 100a, a second LED component 100b and a third LED component 100c are the same as the LED component 100 shown in FIGS. 6 and 7.

Referring to FIG. 8b, a first substrate 101a of the first LED component 100a and a second substrate 101b of the second LED component 100b are attached to a circuit board 201. The first LED component 100a and the second LED component 100b are covered with a lens 203. In one embodiment, the lens 203 comprises a phosphor material. In other embodiment, the lens 203 does not comprise phosphor materials.

In this embodiment, a first LED chip 10a of the first LED component 100a and a second LED chip 10b of the second LED component 100b emit different colors. The surface of first LED chip 10a may be covered by a phosphor material 202 to emit a first color. The second LED chip 10b, that maybe free of phosphor material, emits a second color. The first color and the second color combine to form a third color. For example, the first LED component 100a may include a blue LED chip covered with a yellow phosphor, and the second LED component 100b may include a red LED chip so that the combined output of the chips forms a white color.

Referring to FIG. 8B, another embodiment of the LED module 1001 is shown. The first LED component 100a and the second LED component 100b are attached to the circuit board 201 and covered by the lens 203. A second light sensor 205 not underneath either the first LED chip 10a or the second LED chip 10b is positioned on the circuit board 201. In one embodiment, the second light sensor 205 is not covered by the lens 203. The first LED chip 10a of the first LED module 100a may be covered by the phosphor material 202 on the surface of the first LED chip 10a to emit a first color. The second LED chip 10b of the second LED module 100b, that maybe free of phosphor material, emits a second color. The first color and the second color combine to form a third color, which is detected by the second light sensor 205.

Referring to FIG. 8c, another embodiment of the LED module 1001 is shown. The first LED component 100a, the second LED component 100b, and the third LED component 100c are attached to the circuit board 201 and covered by the lens 203. The first LED chip 10a of the first LED component 100a, the second LED chip 10b of the second LED component 100b, and the third LED chip 10c of the third LED component 100c emit a first color, a second color and a third color, respectively. In one embodiment, the first color, the second color and the third color are different. The first color, the second color, and the third color are combined to form a fourth color. For example, blue, red and green are combined to form white. In other embodiment, the first LED chip 10a of the first LED module 100a may be covered by a phosphor material on the surface of the first LED chip 10a to emit a first color. The second LED chip 10b and the third LED chip 10c, which may be free of phosphor material, emit a second color. The second LED 10b chip and the third LED chip 10c do not turn on at the same time. One of the second LED chip 10b and the third LED chip 10c is turned on while the other is used as a spare. The first color and the second color are combined to form a third color. For example, the blue chip covered with yellow phosphor may combine with a red chip to form a white color.

Referring to FIG. 8C, another embodiment of the LED module 1001 is shown. The first LED component 100a, the second LED component 100b, and the third LED component 100c are attached to the circuit board 201 and covered by the lens 203. A second light sensor 205 not underneath any of the first LED chip 10a, the second LED chip 10b or the third LED chip 10c is positioned on the circuit board 201. In one embodiment, the second light sensor 205 is uncovered by the lens 203. The first LED chip 10a of the first LED component 100a, the second LED chip 10b of the second LED component 100b, and the third LED chip 10c of the third LED component 100c emit a first color, a second color and a third color, respectively. In one embodiment, the first color, the second color, and the third color are different. The first color, the second color, and the third color are combined to form a fourth color, which is detected by the second light sensor 205. For example, blue, red and green are combined to form white.

FIGS. 9 and 10 are diagrams of methods 300 and 400 for operating a LED module with optical feedback and control. FIGS. 8A, 8B and 8C illustrate various embodiments of cross-sectional views for the LED module that may be operated by the method 300. FIGS. 8b and 8c illustrate various embodiments of cross-sectional views of LED modules that may be operated by the method 400.

The method 300 for operating an LED module begins at step 301. The LED module 1001 shown in FIG. 8A is provided as an example. The LED module 1001 comprises at least one LED component 100, which is attached to a circuit board 201. The LED component 100 comprises a LED chip 10 as shown in FIG. 5 and a first light sensor 103 underneath the LED chip 10 in a first substrate 101. One side of the LED chip 10 is covered by an opaque layer 119 with an opening 112. The opening 112 is substantially aligned with the first light sensor 103. The circuit board 201 comprises a second light sensor 205 not underneath the LED chip 10. The LED component 100 is covered by a lens 203 and the second light sensor 205 on the circuit board 201 is not covered by the lens 203. In one embodiment, the lens 203 comprises a phosphor material.

At step 303 in FIG. 9, a measurement sequence is initiated when the power is turned on and provided to the LED module 1001.

At step 305 in FIG. 9, a light output with a first wavelength, or a first color, is emitted from the LED chip 10. Then, the light output with the first wavelength excites the phosphor material in the lens 203 to convert the light output with a second wavelength, or a second color. The light output with the second wavelength, or the second color, emits from the LED module 1001. For example, the LED chip 10 emitting blue light excites yellow phosphor to convert the light output from the LED module 1001 to white light.

At step 307 in FIG. 9, the light output with the first wavelength, or the first color emitting from the LED chip 10 that penetrates through the opening 112, is collected by the first light sensor 103. The light output with the second wavelength, or the second color emitting from the LED module 1001, is collected by the second light sensor 205. The distance between the opening 112 and the first light sensor 103 is small. Hence, the light output with the first wavelength from the opening 112 is collected by the first light sensor 103 accurately. The light output with the first wavelength and the second wavelength are collected by the first light sensor 103 and the second light sensor 205 respectively. The lights of the different wavelengths do not interfere with each other. As described in a previous example, blue light would be detected by the first light sensor 103 and white light would be detected by the second light sensor 205.

At step 308 in FIG. 9, predetermined desired settings for the light output of the first wavelength and the second wavelength are stored in a storage apparatus.

At step 309 in FIG. 9, the light output with the first wavelength and the second wavelength collected by the first light sensor 103 and the second light sensor 205 are compared with the predetermined desired settings.

At step 311 in FIG. 9, a comparison is made to determine whether the light output with the first wavelength collected by the first light sensor 103 matches the predetermined desired settings. As with the previously described examples, blue light detected by the first light sensor 103 is measured to determine whether it matches predetermined desired settings or not. If the detected light matches the predetermined desired setting, the process continues to step 315. If the detected light does not match the predetermined desired setting, an adjustment is made at a step 313 to alter an electrical current to the LED component 100 for better achieving the setting for the first wavelength, and the measuring sequence step 303 is repeated.

At step 315 in FIG. 9, a comparison is made to determine whether the light output of the second wavelength collected by the second light sensor 205 matches the predetermined desired settings. As with the previously described examples, white light detected by the second light sensor 205 is measured to determine whether it matches predetermined desired settings or not. If the detected light matches the predetermined desired setting, the process continues by returning to the measuring sequence step 303. If the detected light does not match the predetermined desired setting, an adjustment is made at a step 313 to alter the electrical current to the LED component 100 for better achieving the setting for the second wavelength and the measuring sequence step 303 is repeated.

In FIG. 10, the method 400 for operating an LED module begins at step 401. The LED module 1001 shown in FIG. 8b is provided as an example. The LED module 1001 comprises at least two LED components, such as a first LED component 100a and a second LED component 100b. The at least two LED components are attached to a circuit board 201. Each of the at least two LED components emit different color. Each of the LED components comprises a LED chip 10 as shown in FIGS. 5 and 6, and a light sensor 103 in a substrate 101. One side of each LED chip 10 is covered by an opaque layer 119 with an opening 112. The opening 112 is substantially aligned with the light sensor 103. The first LED component 100a and the second LED component 100b are covered by a lens 203. In one embodiment, the surface of the LED chip 10 is covered by a phosphor material.

At step 403 in FIG. 10, a measurement sequence is initiated when the power to the circuit board 201 is turned on and provided to the LED module 1001.

At step 405 in FIG. 10, a light output with a wavelength or a color emits from each LED chip 10 of at least two LED components 100a and 100b. Each LED chip of the at least two LED components emits different color.

At step 407 in FIG. 10, the light output with the wavelength or the color emitting from each LED chip 10 that penetrates through the opening 112 is collected by each of the light sensors 103 of each LED component, respectively. For each LED component, the distance between the opening 112 and the light sensor 103 is small. Hence, the light output from different LED chips will not interfere each other. The light output from each LED chip could be collected by the respective light sensor 103 accurately.

At step 408 in FIG. 10, predetermined desired settings for the light output of each LED chip in each LED component are stored in a storage apparatus.

At step 409 in FIG. 10, the light output of each LED chip with the wavelength collected by the light sensor 103 in each LED component are compared with the predetermined desired settings.

At step 411 in FIG. 10, a comparison is made to determine whether the light output of each LED chip with the wavelength collected by the light sensor 103 in each LED component matches the predetermined desired setting. If the detected light matches the predetermined desired setting, the process continues to the measuring sequence step 403. If the detected light does not match the predetermined desired setting, an adjustment is made at step 413 to alter an electrical current to each LED component for better achieving the setting for the wavelength and the measuring sequence step 403 is repeated.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. An apparatus, comprising:
a substrate;
a light-sensing element disposed in the substrate; and
a light-emitting diode (LED) chip disposed over, and electrically coupled to, the substrate, the LED chip containing a light-emitting layer and a light-reflective layer disposed between the light-emitting layer and the substrate, wherein the light-reflective layer includes an opening that is aligned with the light-sensing element.

2. The apparatus of claim 1, wherein the light-sensing element includes a photodiode.

3. The apparatus of claim 1, wherein the LED chip further comprises:
a first doped semiconductor layer and a second doped semiconductor layer disposed on opposite sides of the light-emitting layer, the first and second doped semiconductor layers having different types of conductivity; and
a growth substrate coupled to one of the first and second doped semiconductor layers.

4. The apparatus of claim 3, wherein the MQW layer is disposed between the growth substrate and the light-reflective layer.

5. The apparatus of claim 3, wherein the growth substrate is disposed between the MQW layer and the light-reflective layer.

6. The apparatus of claim 1, wherein the light-sensing element is wider than the opening.

7. The apparatus of claim 1, wherein:
the substrate includes a first side and a second side opposite the first side;
the LED chip is disposed over the first side of the substrate; and
the light-sensing element is disposed near the first side.

8. The apparatus of claim 7, further comprising:
a circuit board attached to the second side of the substrate; and
a lens disposed over the circuit board, wherein the substrate and the LED chip are housed within the lens.

9. The apparatus of claim 8, further comprising a further light sensor disposed over the circuit board and outside of the lens.

10. The apparatus of claim 8, further comprising: a further LED chip disposed over the circuit board and housed within the lens, wherein the LED chip and the further LED chip are configured to emit different colors of light.

11. A method, comprising:
forming a light-sensing element in a substrate;
providing a light-emitting diode (LED) chip, the LED chip including:
a first doped semiconductor layer and a second doped semiconductor layer having different types of conductivity;
a light-emitting layer disposed between the first doped semiconductor layer and the second doped semiconductor layer; and
a light-reflective layer configured to reflect light emitted by the light-emitting layer, the light-reflective layer having an opening; and
bonding the LED chip to the substrate in a manner such that the opening of the light-reflective layer is aligned with the light-sensing element.

12. The method of claim 11, wherein the bonding the LED chip comprises bonding the LED chip through solder bumps.

13. The method of claim 11, wherein the bonding the LED chip comprises a wire bonding process.

14. The method of claim 11, further comprising:
attaching the substrate to a circuit board, wherein the circuit board and the LED chip are disposed on different sides of the substrate; and
forming a lens over the circuit board, the lens covering the LED chip and the substrate.

15. The method of claim 14, further comprising: forming a further light sensor over an area of the circuit board outside of the lens.

16. The method of claim 14, further comprising:
providing a further LED chip;
bonding the further LED chip to a further substrate; and
attaching the further LED chip to the circuit board through the further substrate;
wherein:
the further LED chip is housed within the lens; and
the LED chip and the further LED chip are configured to emit different colors of light.

17. A method, comprising:
providing a light-emitting diode (LED) module that contains a circuit board and one or more LED components located over the circuit board, wherein each LED component includes an LED chip bonded to a substrate having an embedded light sensor;
sensing a first light and a second light emitted by the LED module, the first light having a first wavelength and the second light having a second wavelength;

comparing the first wavelength and the second wavelength to a predetermined target first wavelength and a predetermined target second wavelength; and adjusting an electrical current driving the one or more LED components based on the comparing.

18. The method of claim 17, wherein:

the one or more LED components include a first LED component and a second LED component;

the first light is emitted by a first LED chip and sensed by a first light sensor of the first LED component; and the second light is emitted by a second LED chip and sensed by a second light sensor of the second LED component.

19. The method of claim 17, wherein:

the LED module further includes a non-embedded light sensor disposed over the circuit board;

the first light is emitted by the LED chip and sensed by the embedded light sensor of one of the LED components; and the second light is emitted by one of the LED components and sensed by the non-embedded light sensor.

20. The method of claim 17, wherein each LED chip includes a light-reflective layer with an opening that is aligned with the embedded light sensor.

* * * * *